(12) United States Patent
Baek et al.

(10) Patent No.: US 9,295,168 B2
(45) Date of Patent: Mar. 22, 2016

(54) FLEXIBLE DISPLAY DEVICE

(71) Applicants: Jong-In Baek, Yongin (KR); Yi-Joon Ahn, Yongin (KR)

(72) Inventors: Jong-In Baek, Yongin (KR); Yi-Joon Ahn, Yongin (KR)

(73) Assignee: SAMSUNG DISPLAY CO., LTD., Yongin, Gyunggi-Do (KR)

( * ) Notice: Subject to any disclaimer, the term of this patent is extended or adjusted under 35 U.S.C. 154(b) by 139 days.

(21) Appl. No.: 13/795,706

(22) Filed: Mar. 12, 2013

(65) Prior Publication Data

US 2014/0055924 A1 Feb. 27, 2014

(30) Foreign Application Priority Data

Aug. 24, 2012 (KR) .................. 10-2012-0093296

(51) Int. Cl.
| | |
|---|---|
| *H05K 5/00* | (2006.01) |
| *H01L 51/00* | (2006.01) |
| *F16F 1/02* | (2006.01) |
| *H04M 1/02* | (2006.01) |
| *G02F 1/1333* | (2006.01) |

(52) U.S. Cl.
CPC .............. *H05K 5/0017* (2013.01); *F16F 1/027* (2013.01); *G02F 1/133308* (2013.01); *H01L 51/0097* (2013.01); *G02F 1/133305* (2013.01); *G02F 2001/133314* (2013.01); *G02F 2001/133322* (2013.01); *H04M 1/0268* (2013.01); *Y02E 10/549* (2013.01)

(58) Field of Classification Search
CPC ...................................................... H05K 5/00
USPC ............. 361/679.01–679.45, 679.55–679.61, 361/724–727, 728–747, 752–759, 361/796–837; 345/175, 650, 55, 173, 174, 345/176; 368/69, 82; 312/223.2, 7.1, 319.9, 312/333, 348.3, 222, 226; 455/575.1–575.5, 347, 550.1, 90.3
See application file for complete search history.

(56) References Cited

U.S. PATENT DOCUMENTS

| | | | | | |
|---|---|---|---|---|---|
| 4,066,855 | A | * | 1/1978 | Zenk .................... | H01H 13/702 200/306 |
| 5,285,398 | A | * | 2/1994 | Janik ....................... | G06F 1/163 361/679.03 |
| 5,305,181 | A | * | 4/1994 | Schultz ................... | B60R 11/02 345/168 |
| 5,361,169 | A | * | 11/1994 | Deal ....................... | B63C 11/02 359/517 |
| 5,418,760 | A | * | 5/1995 | Kawashima ........ | G02F 1/13306 341/23 |
| D362,396 | S | * | 9/1995 | Chester ........................ | D10/128 |
| 5,734,513 | A | * | 3/1998 | Wang ................... | G02B 25/002 345/32 |
| 5,857,217 | A | * | 1/1999 | Hsueh ................... | A44C 5/0007 2/170 |
| 5,931,764 | A | * | 8/1999 | Freeman .................. | G04G 9/00 361/679.03 |
| 6,107,988 | A | * | 8/2000 | Phillipps ............... | G06F 1/1616 345/156 |
| 6,220,916 | B1 | * | 4/2001 | Bart ....................... | A63H 33/00 434/393 |
| 6,377,324 | B1 | * | 4/2002 | Katsura ............. | G02F 1/133305 349/58 |
| 6,425,494 | B1 | * | 7/2002 | Woods, II .......... | B65D 81/3879 215/12.1 |

(Continued)

FOREIGN PATENT DOCUMENTS

| | | |
|---|---|---|
| KR | 2002-0007278 A | 1/2002 |
| KR | 10-2010-0110968 A | 10/2010 |

(Continued)

*Primary Examiner* — Courtney Smith
*Assistant Examiner* — Rashen E Morrison
(74) *Attorney, Agent, or Firm* — Lee & Morse, P.C.

(57) ABSTRACT

A flexible display device includes a flexible display unit configured to display images, and a slap portion on the flexible display unit, the slap portion having a curvature and being configured to bend together with the flexible display unit.

16 Claims, 13 Drawing Sheets

(56) References Cited

U.S. PATENT DOCUMENTS

| | | | | |
|---|---|---|---|---|
| 6,577,496 B1 * | 6/2003 | Gioscia | G06F 1/1616 | 345/156 |
| 6,621,766 B2 * | 9/2003 | Brewer | G02B 26/026 | 368/10 |
| D543,122 S * | 5/2007 | Lafever | D10/32 | |
| 7,347,019 B1 * | 3/2008 | Shaw | F16F 1/025 | 40/607.01 |
| 7,414,594 B2 * | 8/2008 | Kim | G02F 1/133526 | 345/1.1 |
| 7,558,057 B1 * | 7/2009 | Naksen | G06F 1/1613 | 361/679.3 |
| 7,848,093 B2 * | 12/2010 | Hardson | A44B 11/001 | 224/163 |
| 8,011,124 B1 * | 9/2011 | Temples | G09F 3/005 | 40/633 |
| 8,082,003 B2 * | 12/2011 | Jee | G04G 17/045 | 455/556.1 |
| 8,213,167 B2 * | 7/2012 | Kim | G02F 1/13336 | 345/1.1 |
| 8,369,075 B2 * | 2/2013 | Huang | G09F 9/33 | 248/297.21 |
| 8,462,106 B2 * | 6/2013 | Tziortzis | G06F 3/01 | 345/156 |
| D686,217 S * | 7/2013 | Andre | D11/2 | |
| 8,482,909 B2 * | 7/2013 | Douglas | A44C 5/0015 | 361/679.03 |
| 8,506,158 B2 * | 8/2013 | Keung | A44C 5/0084 | 224/164 |
| 8,610,663 B2 * | 12/2013 | Kim | G06F 3/033 | 345/156 |
| 8,727,189 B2 * | 5/2014 | Zieman | D05B 91/00 | 223/109 A |
| 8,801,577 B2 * | 8/2014 | Dibenedetto | A63B 24/0062 | 482/8 |
| 8,890,911 B2 * | 11/2014 | Moriwaki | G09G 3/3208 | 345/1.3 |
| 8,970,455 B2 * | 3/2015 | Thorson | G06F 3/147 | 345/105 |
| 2003/0026171 A1 * | 2/2003 | Brewer | G02B 26/026 | 368/82 |
| 2003/0155389 A1 * | 8/2003 | Swartzentruber | A44C 5/12 | 224/164 |
| 2004/0156270 A1 * | 8/2004 | Weng | G04C 19/00 | 368/82 |
| 2006/0007368 A1 * | 1/2006 | Slikkerveer | G09F 9/35 | 349/58 |
| 2006/0050169 A1 * | 3/2006 | Misawa | G06F 1/1616 | 348/333.06 |
| 2006/0146488 A1 * | 7/2006 | Kimmel | G06F 1/1616 | 361/679.04 |
| 2006/0209218 A1 * | 9/2006 | Lee | G04G 9/00 | 349/1 |
| 2006/0273304 A1 * | 12/2006 | Cok | H01L 51/0096 | 257/40 |
| 2006/0274036 A1 * | 12/2006 | Hioki | G06F 3/0412 | 345/156 |
| 2008/0303782 A1 * | 12/2008 | Grant | G06F 1/1615 | 345/156 |
| 2009/0126243 A1 * | 5/2009 | Schellingerhout | G09F 21/02 | 40/586 |
| 2009/0298554 A1 * | 12/2009 | Kim | H04M 1/21 | 455/574 |
| 2010/0029327 A1 * | 2/2010 | Jee | G04G 17/045 | 455/556.1 |
| 2010/0222110 A1 * | 9/2010 | Kim | G06F 1/1616 | 455/566 |
| 2010/0227642 A1 * | 9/2010 | Kim | H04M 1/72575 | 455/556.1 |
| 2011/0086680 A1 * | 4/2011 | Kim | G06F 1/1626 | 455/574 |
| 2011/0188189 A1 * | 8/2011 | Park | G05B 11/01 | 361/679.05 |
| 2011/0261002 A1 * | 10/2011 | Verthein | G06F 1/181 | 345/174 |
| 2012/0002360 A1 * | 1/2012 | Seo | G06F 1/1616 | 361/679.01 |
| 2012/0200991 A1 * | 8/2012 | Ryu | G06F 1/1601 | 361/679.01 |
| 2012/0314546 A1 * | 12/2012 | Brewer | G04G 17/04 | 368/281 |
| 2013/0010405 A1 * | 1/2013 | Rothkopf | H04M 1/0216 | 361/679.01 |
| 2013/0044215 A1 * | 2/2013 | Rothkopf | G06F 1/163 | 348/143 |
| 2013/0083496 A1 * | 4/2013 | Franklin | G06F 1/1626 | 361/749 |
| 2013/0120106 A1 * | 5/2013 | Cauwels | G06F 1/163 | 340/3.1 |
| 2013/0120459 A1 * | 5/2013 | Dickinson | G06F 1/163 | 345/650 |
| 2013/0191741 A1 * | 7/2013 | Dickinson | G06F 1/163 | 715/702 |
| 2013/0235008 A1 * | 9/2013 | Kwon | G09G 3/20 | 345/204 |
| 2013/0265631 A1 * | 10/2013 | Ahn | G09F 9/372 | 359/295 |
| 2014/0055924 A1 * | 2/2014 | Baek | H05K 5/0017 | 361/679.01 |
| 2014/0160078 A1 * | 6/2014 | Seo | G06F 3/017 | 345/175 |
| 2014/0337621 A1 * | 11/2014 | Nakhimov | G06F 1/163 | 713/168 |
| 2015/0087919 A1 * | 3/2015 | Johnson | A61B 5/486 | 600/301 |
| 2015/0111088 A1 * | 4/2015 | Hiroki | H01M 10/0436 | 429/149 |
| 2015/0121228 A1 * | 4/2015 | Lee | G06F 3/167 | 715/727 |
| 2015/0123106 A1 * | 5/2015 | Yasumoto | B32B 43/006 | 257/40 |
| 2015/0187855 A1 * | 7/2015 | Yamazaki | H01L 27/3262 | 257/40 |

FOREIGN PATENT DOCUMENTS

| | | |
|---|---|---|
| KR | 10-2010-0118218 A | 11/2010 |
| WO | WO 00/25193 A2 | 5/2000 |

* cited by examiner

FLEXIBLE DISPLAY DEVICE

CROSS-REFERENCE TO RELATED PATENT APPLICATION

This application claims the benefit of priority under 35 U.S.C. §119 Korean Patent Application No. 10-2012-0093296, filed on Aug. 24, 2012, in the Korean Intellectual Property Office, the disclosure of which is incorporated herein in its entirety by reference.

BACKGROUND OF THE INVENTION

1. Field of the Invention

Example embodiments relate to a flexible display device, and more particularly, to a flexible display device that is portable and capable of conveniently maintaining a shape of a flexible display unit.

2. Description of the Related Art

In general, flat display devices are classified into a light-emitting type and a light-receiving type. Light-emitting type display devices include an organic light emitting display device, a plasma display panel (PDP), a flat cathode ray tube (FCRT), a vacuum fluorescent display (VFD) panel, a light emitting diode (LED) panel, etc. Light-receiving type display devices include a liquid crystal display (LCD) panel, etc.

From among the flat display devices, the organic light emitting display device has a wide viewing angle, an excellent contrast, and a high response time. As such, the organic light emitting display device may be used in mobile devices, e.g., digital cameras, video cameras, camcorders, portable information terminals, smart phones, ultra-slim notebook computers, and tablet personal computers, and in electronic/electric products, e.g., ultra-thin televisions.

SUMMARY OF THE INVENTION

Example embodiments provide a flexible display device having a slap portion on one surface of a flexible display unit, in order to conveniently maintain a shape of the flexible display unit and to allow the flexible display device to be easily portable.

According to an aspect of the example embodiments, there is provided a flexible display device including a flexible display unit configured to display images, and a slap portion on the flexible display unit, the slap portion having a curvature and being configured to bend together with the flexible display unit.

The slap portion may include a transforming portion having a streamlined cross-section from a flexure vertex to two edges; and a housing portion wrapped around the transforming portion.

The transforming portion may include a flexible metal sheet.

The housing portion may be formed of an elastic material.

The transforming portion may be formed to have a streamlined cross-section in a width direction that is a bending direction and a linear side surface in a length direction that is perpendicular to the bending direction, in a spread state, and to have a linear cross-section in the width direction that is the bending direction, and a streamlined side surface in the length direction perpendicular to the bending direction, in a bent state.

The housing portion may have a curvature corresponding to the curvature of the transforming portion.

The flexible display unit may be bonded onto the transforming portion with a curvature corresponding to the curvature of the transforming portion.

The transforming portion may have one of a solid pattern, a linear pattern, a grid pattern, a wave pattern, a curve pattern, and a zigzag pattern.

The housing portion may include a first portion wrapped around the transforming portion; and a second portion including space portions formed at two edges of the first portion.

The second portion may be located to correspond to two edges of the flexible display unit in a width direction or a length direction of the flexible display unit.

The flexible display unit may be bonded onto the slap portion, and a non-transforming portion including a rigid element and not overlapping the slap portion may extend from one edge of the flexible display unit.

A holder may be formed on one surface of the flexible display unit, and the slap portion may be held by the holder.

The slap portion may have a length less than the length of the flexible display unit.

The holder may be bonded along two edges of the flexible display unit, and may have a plurality of guide grooves into which a plurality of slap portions are fitted.

A protection holder having an auxiliary guide groove for guiding the slap portion to be aligned from one edge to another edge of the flexible display unit may be formed at a center portion of the flexible display unit.

BRIEF DESCRIPTION OF THE DRAWINGS

The above and other features and advantages of the example embodiments will become more apparent by describing in detail thereof with reference to the attached drawings, in which.

DETAILED DESCRIPTION OF THE INVENTION

Figure 1A:
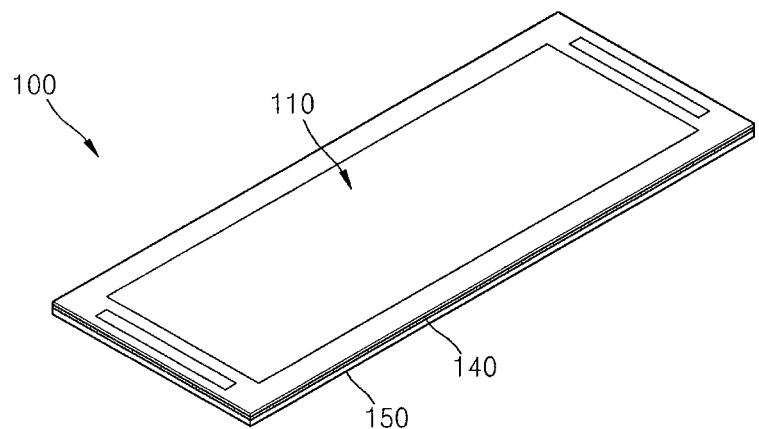
FIG. 1A is a perspective view showing a spread state of a flexible display device having a slap portion according to an embodiment.

While exemplary embodiments are susceptible to various modifications and alternative forms, specific embodiments thereof are shown by way of example in the drawings and will be described herein in detail. It should be understood, however, that there is no intent to limit the exemplary embodiments to the particular forms disclosed, but conversely, the exemplary embodiments are to cover all modifications, equivalents, and alternatives falling within the inventive spirit and scope. In the following description of the example embodiments, a detailed description of known functions and configurations incorporated herein will be omitted when it may make the subject matter of the example embodiments unclear.

It will be understood that, although the terms first, second, etc. may be used herein to describe various elements, these elements should not be limited by these terms. These terms are only used to distinguish one element from another.

The terminology used herein is for the purpose of describing particular embodiments only and is not intended to be limiting of exemplary embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items.

Hereinafter, the example embodiments will be described in detail with reference to the attached drawings. Like reference numerals in the drawings denote like elements and thus repeated descriptions will be omitted.

Figure 1B:
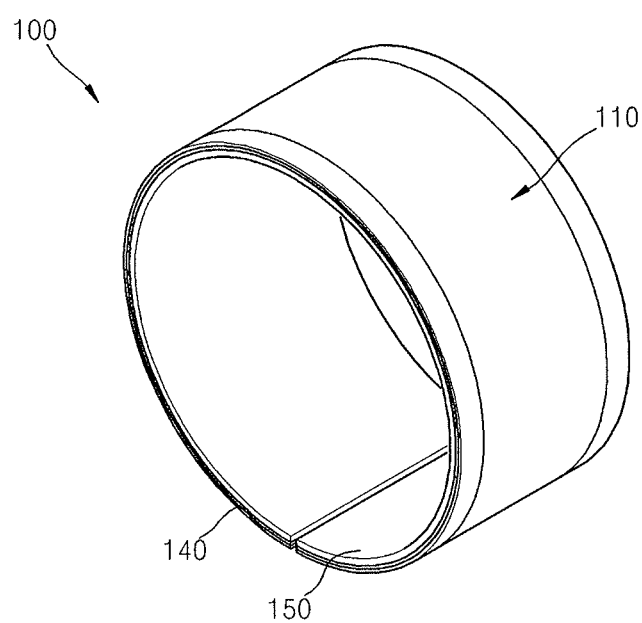
FIG. 1B is a perspective view showing a bent state of the flexible display device illustrated in FIG. 1A.

FIG. 1A is a perspective view showing a spread state of a flexible display device 100 having a slap portion 150 according to an embodiment. FIG. 1B is a perspective view showing a bent state of the flexible display device 100 illustrated in FIG. 1A.

Referring to FIGS. 1A and 1B, the flexible display device 100 includes a flexible display unit 110 for displaying an image. The flexible display unit 110 includes at least one thin film transistor (TFT) and an organic light emitting diode (OLED). Although the flexible display unit 110 in FIGS. 1A-1B is an organic light emitting display device, the flexible display device 100 may also be applied to other display devices, e.g., a LCD panel, a field emission display device, an electroluminescent display device, or an electrophoretic display device. The flexible display unit 110 may be coupled to, e.g., a touch screen, a display driver integrated circuit (DDI), a flexible printed circuit board (FPCB), a polarizing plate, a window cover, and the like.

A casing 140 for mounting the flexible display unit 110 may be formed under the flexible display unit 110. The casing 140 is not limited to any one material as long as the material is flexible.

The slap portion 150 that is bent together with the flexible display unit 110 is formed under the casing 140. The slap portion 150 is formed to have a curved cross-section along one direction. The flexible display unit 110 may be mounted on the slap portion 150, and may be spread in a bar shape or may be wound, e.g., around the wrist, so as to display an image or to be portable.

Figure 2:
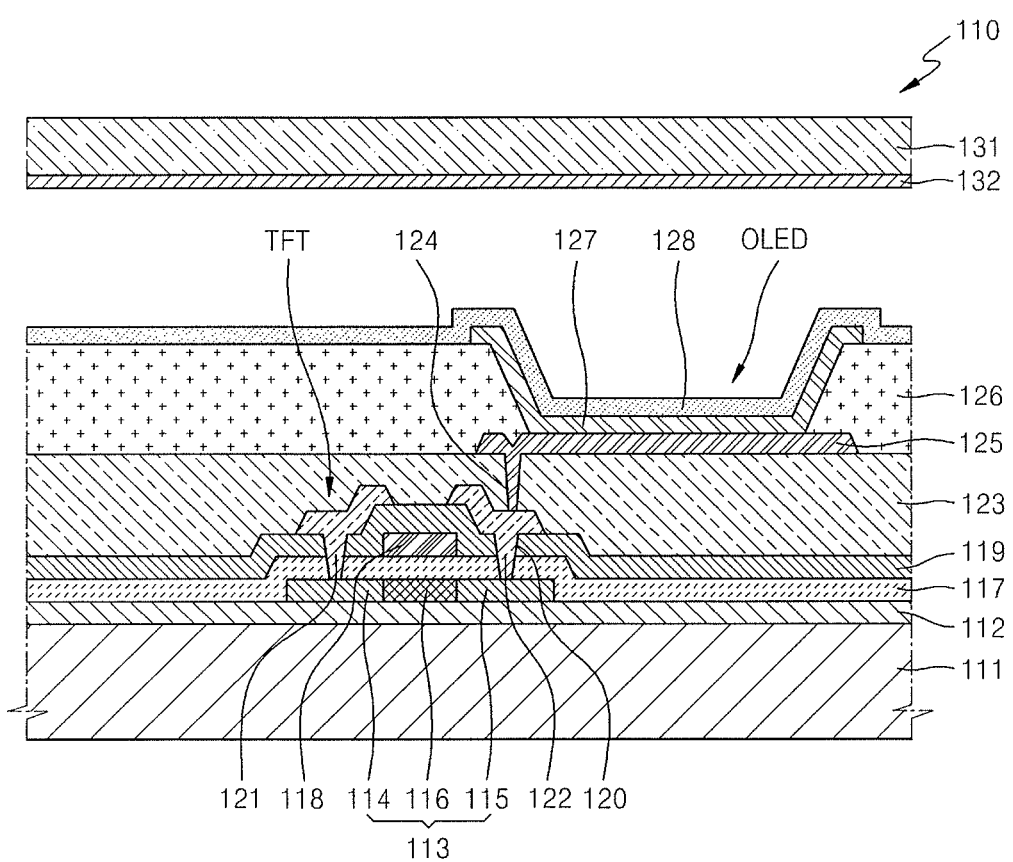
FIG. 2 is a cross-sectional view of a sub pixel of the flexible display unit illustrated in FIG. 1A.

FIG. 2 is a cross-sectional view of a sub pixel of the flexible display unit 110 illustrated in FIG. 1A.

Referring to FIG. 2, the flexible display unit 110 includes a substrate 111. The substrate 111 is a flexible substrate. For example, in comparison to a glass substrate, the flexible substrate 111 may be formed of a material having a small specific gravity, light, hardly breakable, and bendable. For example, the flexible substrate 111 may be formed of a polymer material, e.g., polyimide (PI), polycarbonate (PC), polyethersulfone (PES), polyethylene terephthalate (PET), polyethylene naphthalate (PEN), polyarylate (PAR), or fiber glass reinforced plastic (FRP).

Although a small thickness of the substrate 111 is advantageous to obtain a light and thin display, the substrate 111 should have a thickness sufficient to bear weights of an element and a thin film layer formed on the substrate 111 in a manufacturing process. For example, the substrate 111 may be a thin film substrate having a thickness of about 10 μm to about 100 μm. If the thickness of the substrate 111 is less than 10 μm, the substrate 111 may not stably maintain shapes of an element and a thin film layer formed thereon in a manufacturing process. If the thickness of the substrate 111 is greater than 100 μm, the substrate 111 may not be flexible.

A first barrier layer 112 is formed on the substrate 111. The first barrier layer 112 may be formed of an inorganic material, e.g., $SiO_x$, $SiN_x$, SiON, AlO, or AlON, an organic material, e.g., acryl or polyimide, or an alternate stack of the organic material and the inorganic material. The first barrier layer 112 blocks oxygen and moisture, prevents the spread of an impurity or moisture generated from the substrate 111, and promotes crystallization of a semiconductor by adjusting the speed of transferring heat in a crystallization process.

A TFT is formed on the first barrier layer 112. Although a top-gate TFT is illustrated in FIG. 2, the TFT may also be another type of TFT, e.g., a bottom-gate TFT.

A semiconductor active layer 113 is formed on the first barrier layer 112. If the semiconductor active layer 113 is formed of poly-silicon, amorphous silicon is formed and then is crystallized into poly-silicon. Although a method of crystallizing amorphous silicon includes various methods, e.g., rapid thermal annealing (RTA), solid phase crystallization (SPC), excimer laser annealing (ELA), metal induced crystallization (MIC), metal induced lateral crystallization (MILC), and sequential lateral solidification (SLS), a method that does not require a heating process to a high temperature may be applied to the substrate 111. For example, in a crystallization operation using a low temperature poly-silicon (LTPS) process, by irradiating a laser for a short period of time to activate the semiconductor active layer 113, the substrate 111 may not be exposed to a high temperature greater than 300° C. and the whole process may be performed at a temperature equal to or less than 300° C. As such, the TFT may be formed by using the flexible substrate 111 formed of a polymer material.

A source region 114 and a drain region 115 doped with an N-type or P-type impurity ions are formed in the semiconductor active layer 113. A region between the source region 114 and the drain region 115 is a channel region 116 not doped with an impurity.

A gate insulating layer 117 is vapor-deposited on the semiconductor active layer 113. The gate insulating layer 117 is formed as a single layer of $SiO_2$, or a double layer of $SiO_2$ and $SiN_x$.

A gate electrode 118 is formed on a predetermined region of the gate insulating layer 117. The gate electrode 118 is connected to a gate line (not shown) for supplying a TFT on/off signal. The gate electrode 118 may be formed of a single metal or multiple metals, and may be formed as a single layer of molybdenum (Mo), molybdenum-tungsten (MoW), chromium (Cr), aluminum (Al), magnesium (Mg), nickel (Ni), tungsten (W), or gold (Au), or a multilayer of a combination of the aforementioned metals.

An interlayer insulating layer 119 is formed on the gate electrode 118. A source electrode 121 is electrically connected to the source region 114 and a drain electrode 122 is electrically connected to the drain region 115 through contact holes 120. The interlayer insulating layer 119 may be formed of an insulating material, e.g., $SiO_2$ or $SiN_x$, or an organic insulating material. The contact holes 120 may be formed by selectively removing a portion of the gate insulating layer 117 and a portion of the interlayer insulating layer 119.

A protective layer, i.e., a passivation and/or planarization layer, 123 is formed on the source electrode 121 and the drain electrode 122. The protective layer 123 protects and planarizes the TFT. The protective layer 123 may have various forms. For example, the protective layer 123 may be formed of an organic material such as benzocyclobutene (BCB) or acryl, or an inorganic material such as SiNx, and may be formed as a single layer, a double layer, or a multilayer.

A display element is formed on the TFT. Although an OLED is illustrated in FIG. 2, the display element is not limited thereto and various display elements may be used.

In order to form the OLED, a first electrode 125 is formed on the TFT and is electrically connected to one of the source electrode 121 and the drain electrode 122 through a contact hole 124. The first electrode 125 functions as an anode of the OLED and may be formed of various conductive materials. The first electrode 125 may be formed as a transparent electrode or a reflective electrode according to the OLED. For example, the first electrode 125 may be formed as a transparent electrode by using indium tin oxide (ITO), indium zinc oxide (IZO), zinc oxide (ZnO), or $In_2O_3$, or may be formed as a reflective electrode by forming a reflective layer by using silver (Ag), magnesium (Mg), aluminum (Al), platinum (Pt), palladium (Pd), gold (Au), nickel (Ni), neodymium (Nd), iridium (Ir), chromium (Cr), or a compound thereof, and then forming ITO, IZO, ZnO, or $In_2O_3$ thereon.

A pixel defining layer 126 is formed on the protective layer 123 by using an organic material, so as to cover a portion of the first electrode 125 of the OLED. An organic layer 127 is formed on a portion of the first electrode 125 which is exposed by partially etching the pixel defining layer 126. A second electrode 128 of the OLED is formed on the organic layer 127.

The first and second electrodes 125 and 128 are insulated from each other by the organic layer 127, and apply voltages having different polarities to the organic layer 127 so as to allow the organic layer 127 to emit light. Although the organic layer 127 is patterned to correspond only to each sub pixel, i.e., the patterned first electrode 125, in FIG. 2 for convenience of explaining the structure of a sub pixel, the organic layer 127 may also be integrally formed with the organic layers 127 corresponding to adjacent sub pixels. Alternatively, a partial layer of the organic layer 127 may be formed to correspond to each sub pixel, and the other partial layer of the organic layer 127 may be integrally formed with the partial layers of the organic layers 127 corresponding to adjacent sub pixels. Various modifications are allowed here.

The organic layer 127 may be formed of a low-molecular organic material or a polymer organic material. If a low-molecular organic material is used, the organic layer 127 may be formed as a single layer from among or a stacked multi-layer of a hole injection layer (HIL), a hole transport layer (HTL), an emissive layer (EML), an electron transport layer (ETL), an electron injection layer (EIL), etc. Also, the organic layer 127 may be formed of various organic materials such as copper phthalocyanine (CuPc), N,N-Di(naphthalene-1-yl)-N,N'-diphenyl-benzidine (NPB), and tris-8-hydroxyquinoline aluminum (Alq3). The low-molecular organic material may be formed by using, for example, a vapor deposition method using a mask.

If a polymer organic material is used, the organic layer 127 may include an HTL and an EML. In this case, the HTL is formed of poly(3,4-ethylenedioxythiophene) (PEDOT) and the EML is formed of a polymer organic material such as a poly-phenylene vinylene (PPV)-based material or a polyfluorene-based material. The polymer organic material may be formed by using, for example, a screen printing method or an inkjet printing method. The organic layer 127 is not limited to the above materials and methods, and various modifications are allowed here.

Like the first electrode 125, the second electrode 128 may be formed as a transparent electrode or a reflective electrode. If a transparent electrode is used, the second electrode 128 may be formed by vapor-depositing a metal having a low work function, e.g., lithium (Li), calcium (Ca), lithium fluoride/calcium (LiF/Ca), lithium fluoride/aluminum (LiF/Al), aluminum (Al), magnesium (Mg), or a compound thereof, on the organic layer 127 and then forming an auxiliary electrode on the metal by using a material for forming a transparent electrode, e.g., ITO, IZO, ZnO, or $In_2O_3$. If a reflective electrode is used, the second electrode 128 may be formed by vapor-depositing Li, Ca, LiF/Ca, LiF/Al, Al, Mg, or a compound thereof on a whole surface of a display region.

Meanwhile, the first electrode 125 may be formed as a transparent electrode or a reflective electrode corresponding to the shape of an opening of the sub pixel. The second electrode 128 may be formed as a transparent electrode or a reflective electrode vapor-deposited on a whole surface of a display region. The second electrode 128 does not need to be vapor-deposited on a whole surface of a display region and may be formed in various patterns. In this case, positions of the first and second electrodes 125 and 128 may be switched.

A sealing substrate 131 is formed on the OLED. The sealing substrate 131 and the flexible the substrate 111 may be formed of substantially the same material. The sealing substrate 131 is an easily bendable film. Alternatively, after the OLED is formed, the sealing substrate 131 may seal the OLED by forming an organic material film and/or an inorganic material film on the OLED.

A second barrier layer 132 may be further formed on one surface of the sealing substrate 131 facing the second electrode 128. The second barrier layer 132 may be formed of an inorganic material such as $SiO_x$, $SiN_x$, SiON, AlO, or AlON, an organic material such as acryl or polyimide, or an alternate stack of the organic material and the inorganic material.

Figure 3:
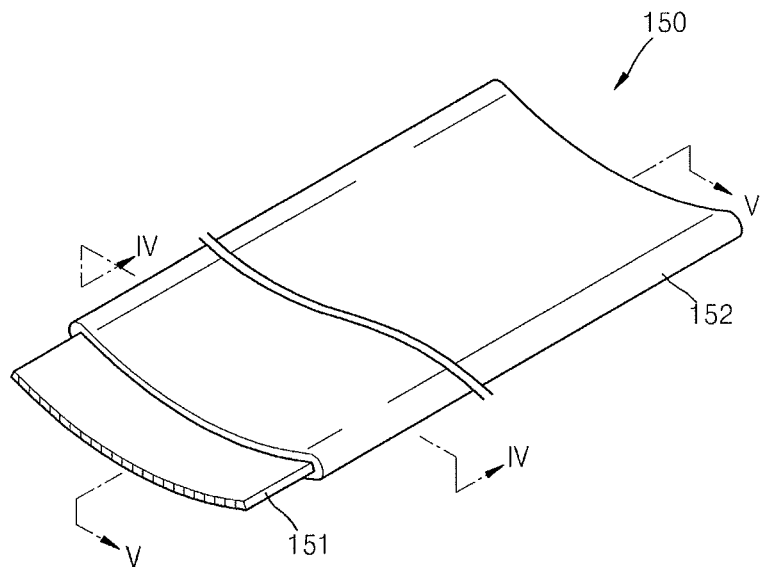
FIG. 3 is a partial perspective view of the slap portion illustrated in FIG. 1.

FIG. 3 is a partial perspective view of the slap portion 150 illustrated in FIG. 1. Referring to FIG. 3, the slap portion 150 includes a transforming portion 151 and a housing portion 152.

The slap portion 150 has characteristics for stably maintaining each of a spread state and a wound state of a display device. For this, the transforming portion 151 is formed by casting a metallic material in a molding frame having a spiral shape. As such, the transforming portion 151 is initially stable in a spirally wound state. Also, in order to spread the transforming portion 151, it should have a streamlined cross-section.

In detail, the transforming portion 151 has a streamlined cross-section, e.g., a curved cross-section, in a width direction that is a bending direction. For example, in a spread state of the slap portion 150, the transforming portion 151 may be curved in its width direction along its entire length. Although a U-shaped cross-section is illustrated in FIG. 3, the transforming portion 151 may also have a different cross-section, e.g., a wave-shaped cross-section. The transforming portion 151 is formed as a flexible metal sheet.

Although the transforming portion 151 may be directly mounted on one surface of the flexible display unit 110 illustrated in FIG. 1, in order to minimize deformation, the transforming portion 151 may be wrapped in the housing portion 152. For example, the housing 152 may directly contact all surfaces of the transforming portion 151, such that the housing 152 completely surrounds and encloses the transforming portion 151. The housing portion 152 is formed of an elastic material, e.g., silicon or rubber. Alternatively, a bonding layer formed of an elastic material may be formed between the flexible display unit 110 and the transforming portion 151.

Since the housing portion 152 is wrapped around the transforming portion 151, unnecessary deformation of the flexible display device 100 due to a difference in curvature radius between the transforming portion 151 and the flexible display unit 110 may be minimized. Also, when the flexible display device 100 is deformed, since a difference between inner and outer circumferences of the transforming portion 151 is offset by the elasticity of the housing portion 152, unnecessary bending does not occur in a spread or wound state.

The housing portion 152 may have a curvature corresponding to, e.g., equal to, the curvature of the transforming portion 151 having a streamlined cross-section and is wrapped around the transforming portion 151. For example, the housing portion 152 may have the same thickness, i.e., a constant thickness, over its entire region as measured from the surface of the transforming portion 151 to a most outer surface of the housing 152, e.g., so the pouter surface of the housing traces the curvature of the transforming portion 151. In another example, the most outer surface of the housing portion 152 may have a rectangular external shape, so its thickness that varies from a vertex of the curved transforming portion 151 toward edges of the transforming portion 151. The housing portion 152 is not limited to any one shape.

Figure 4A:
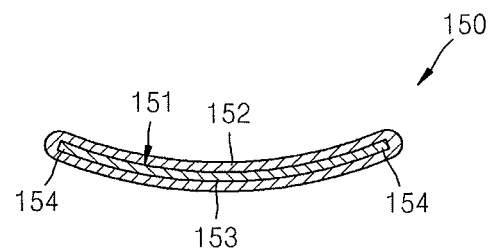
FIG. 4A is a cross-sectional view showing a spread state of the slap portion illustrated in FIG. 3 and cut along a line IV-IV.
Figure 4B:
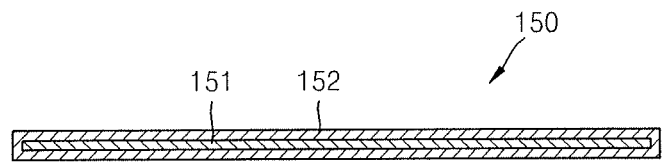
FIG. 4B is a cross-sectional view showing a spread state of the slap portion illustrated in FIG. 3 and cut along a line V-V.

FIG. 4A is a cross-sectional view showing a spread state of the slap portion 150 along line IV-IV of FIG. 3, i.e., along a width direction of the slap portion 150. FIG. 4B is a cross-sectional view showing a spread state of the slap portion 150 along line V-V of FIG. 3, i.e., along a length direction of the slap portion 150.

Referring to FIG. 4A, in a spread state of the slap portion 150, the transforming portion 151 maintains a streamlined cross-section, e.g., a curved cross-section, in the width direction, i.e., a bending direction, of the lap portion 150. Referring to FIG. 4B, the transforming portion 151 maintains a linear side surface in a length direction, i.e., a direction perpendicular to the bending direction, of the slap portion 150. In other words, while the slap portion 150 may be curved in the width direction, a cross-section in any portion of the slap portion 150 along its length direction would have a shape of a straight line.

The transforming portion 151 has a predetermined curvature from a vertex 153 of the curved transforming portion 151 toward edges 154 of the transforming portion 151. For example, as illustrated in FIG. 4A, the transforming portion 151 may have a U-shaped cross-section, so the vertex 153 is in a bottom of the U-shaped cross-section and two edges 154 are at the top of the U-shaped cross-section. Meanwhile, the housing portion 152 has a curvature corresponding to the curvature of the transforming portion 151, and is wrapped around the transforming portion 151.

Figure 5A:
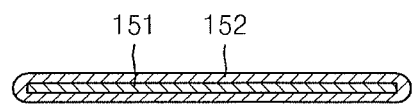
FIG. 5A is a cross-sectional view showing a bent state of the slap portion illustrated in FIG. 3 and cut along the line IV-IV.
Figure 5B:
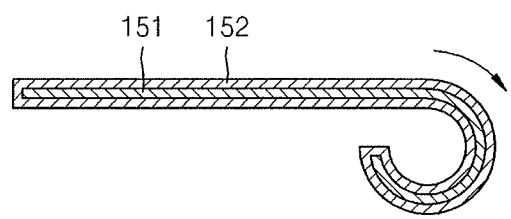
FIG. 5B is a cross-sectional view showing a bent state of the slap portion illustrated in FIG. 3 and cut along the line V-V.

FIG. 5A is a cross-sectional view showing a bent state of the slap portion 150 along line IV-IV of FIG. 3, i.e., along a width direction of the slap portion 150. FIG. 5B is a cross-sectional view showing a spread state of the slap portion 150 along line V-V of FIG. 3, i.e., along a length direction of the slap portion 150.

As illustrated in FIGS. 5A and 5B, in a bent state of the slap portion 150, the transforming portion 151 maintains a linear cross-section in a width direction that is a bending direction. Also, the transforming portion 151 maintains a streamlined side surface in a length direction perpendicular to the bending direction.

As described above, in a spread state, the slap portion 150 has a streamlined cross-section in the width direction with the flexure vertex 153 at a central portion directed in a downward direction, as illustrated in FIG. 4A. In a bent state, the slap portion 150 has a streamlined side surface in a length direction, as illustrated in FIG. 4B. In this case, the slap portion 150 maintains a predetermined curvature from the flexure vertex 153 to the two edges 154, and may be bent by applying a predetermined external force downward. Accordingly, the slap portion 150 is stable in both the spread state and the bent state.

Figure 6:
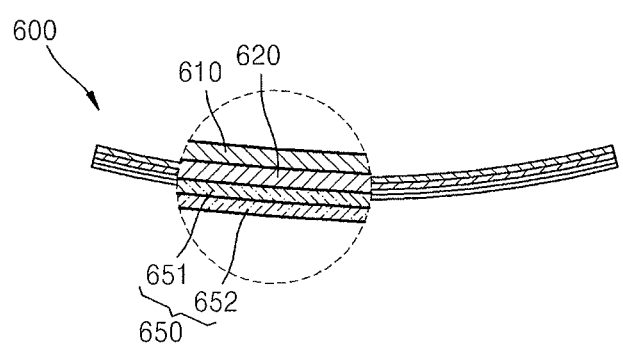
FIG. 6 is a cross-sectional view of a flexible display device cut along a bending direction according to an embodiment.

FIG. 6 is a cross-sectional view of a flexible display device 600 along a bending direction, i.e., along the width direction, according to an embodiment. Referring to FIG. 6, the flexible display device 600 includes a flexible display unit 610, a casing 620 under the flexible display unit 610, and a slap portion 650 under the casing 620.

The slap portion 650 includes a transforming portion 651 having a streamlined cross-section in a width direction. The transforming portion 651 may be formed under the casing 620 directly or after being wrapped in a housing portion 652 having elasticity. In other words, the casing 620 is between the flexible display unit 610 and the slap portion 650. Since the flexible display unit 610 has flexibility, the flexible display unit 610 is bonded onto the transforming portion 651 with a curvature corresponding to a predetermined curvature of the transforming portion 651.

The above-described flexible display device 600 may maintain its strength in a spread state of the transforming portion 651 so as to ensure touch capabilities and readability of the flexible display unit 610 mounted on the transforming portion 651. Further, the flexible display device 600 may be bent, e.g., wound into a ring-shape, along a length direction so as to be portable, e.g., around a wrist.

Figure 7:
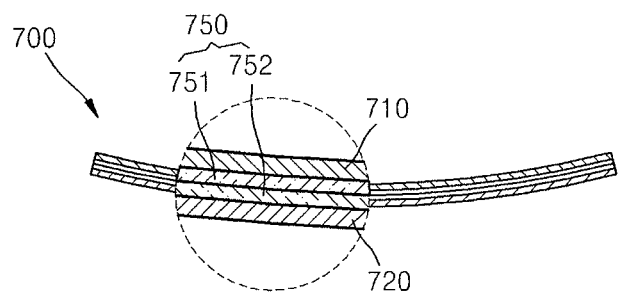
FIG. 7 is a cross-sectional view of a flexible display device cut along a bending direction according to another embodiment.

FIG. 7 is a cross-sectional view of a flexible display device 700 along a bending direction, according to another embodiment. Referring to FIG. 7, the flexible display device 700 includes a flexible display unit 710. Unlike the flexible display device 600 illustrated in FIG. 6, a slap portion 750 of the flexible display device 700 is mounted under the flexible display unit 710. In other words, the slap portion 750 is between the flexible display unit 710 and a casing 720.

The slap portion 750 includes a transforming portion 751 having a streamlined cross-section in a width direction that is a bending direction, and a housing portion 752 wrapped around the transforming portion 651. The above-described flexible display device 700 may be spirally wound and thus may be portable by bending the transforming portion 751 in a direction perpendicular to a length direction.

Also, according other embodiments, the shape of a transforming portion may be modified, so a flexible display device may have a curvature when it is used in a bar shape. That is, the flexible display device may be manufactured on a transforming portion with a predetermined curvature in a length direction when in a spread state.

FIGS. 8 through 11 show various shapes of transforming portions according to embodiments. Although it is illustrated in the following descriptions that a transforming portion is bonded directly onto one surface of a flexible display unit, the transforming portion may be wrapped in a housing portion, i.e., the transforming portion may be bonded onto the flexible display unit via the housing portion.

Figure 8:
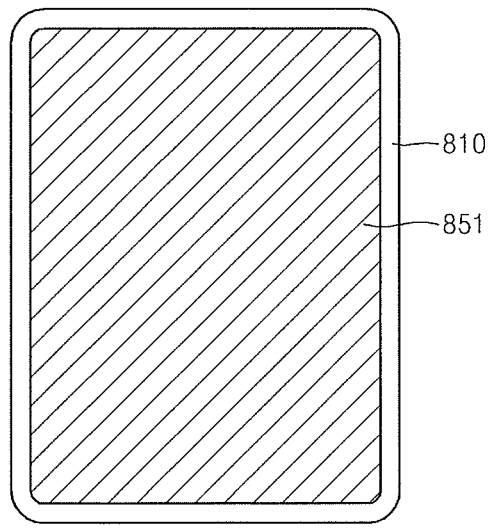
FIG. 8 is a plan view of a transforming portion according to an embodiment.

Referring to FIG. 8, a transforming portion 851 is formed on one surface of a flexible display unit 810. The transforming portion 851 covers an entire region of the flexible display unit 810 and has a solid pattern.

Figure 9:
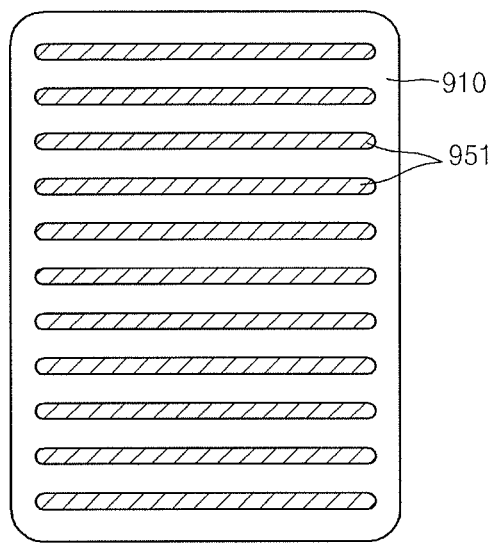
FIGS. 9 through 11 are plan views of transforming portions according to other embodiments.

Referring to FIG. 9, transforming portions 951 are formed on one surface of a flexible display unit 910. The transforming portions 951 are aligned and spaced apart from each other in a horizontal direction of FIG. 9. The transforming portions 951 have a plurality of separate linear patterns. For example, each separate linear pattern of the transforming portions 951 may be wrapped separately in a housing portion.

Figure 10:
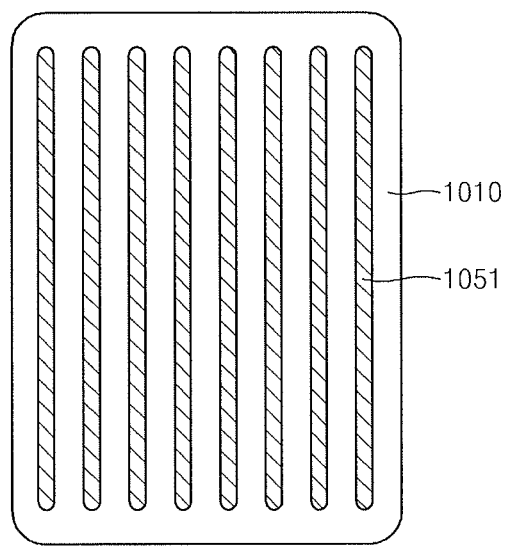

Referring to FIG. 10, transforming portions 1051 are formed on one surface of a flexible display unit 1010. The transforming portions 1051 are aligned and spaced apart from each other in a vertical direction of FIG. 10. The transforming portions 1051 have a plurality of separate linear patterns.

Figure 11:
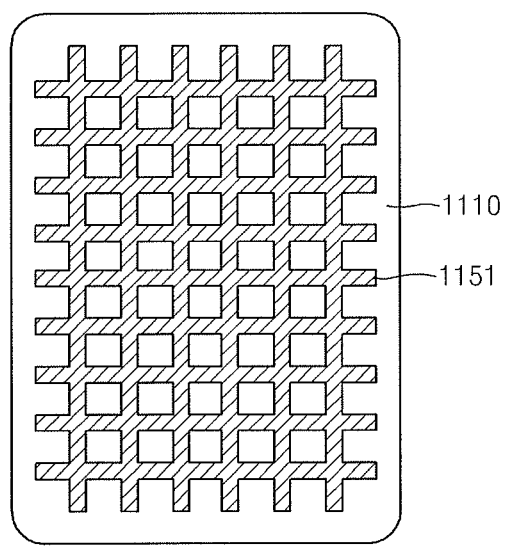

Referring to FIG. 11, a transforming portion 1151 is formed on one surface of a flexible display unit 1110. The transforming portion 1151 covers an entire region of the flexible display unit 1110 and has a grid pattern.

In addition to the above-mentioned solid pattern, the linear pattern, and the grid pattern, the transforming portions 851 through 1151 may have various patterns, e.g., a wave pattern, a curve pattern, and a zigzag pattern.

Figure 12:
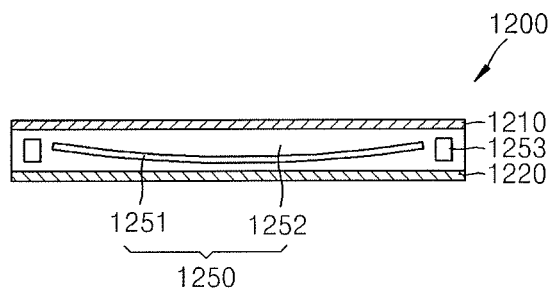
FIG. 12 is a cross-sectional view of a flexible display device having a slap portion and cut along a width direction according to another embodiment.

FIG. 12 is a cross-sectional view of a flexible display device 1200 having a slap portion 1250 and cut along a width direction, according to another embodiment. Referring to FIG. 12, the flexible display device 1200 includes a flexible display unit 1210. The slap portion 1250 is mounted under the flexible display unit 1210. A casing 1220 having flexibility is formed under the slap portion 1250.

The slap portion 1250 includes a transforming portion 1251 having a streamlined cross-section in a width direction, and a housing portion 1252 wrapped around the transforming portion 1251. In this case, when the slap portion 1250 is bonded onto one surface of the flexible display unit 1210, in a spread state, in order to allow the flexible display unit 1210 to have a flat surface, space portions 1253 where the housing portion 1252 is not wrapped around the transforming portion 1251 are formed at two edges of the housing portion 1252 in a width direction. The space portions 1253 correspond to, e.g., positioned at, two edges of the flexible display unit 1210.

Furthermore, the space portions 1253 may also be formed at two edges of the housing portion 1252 in a length direction. As such, since the space portions 1253 exist at two edges of the housing portion 1252 in a width direction or a length direction in the slap portion 1250, when the flexible display device 1200 is bent, margins may be ensured.

Figure 13:
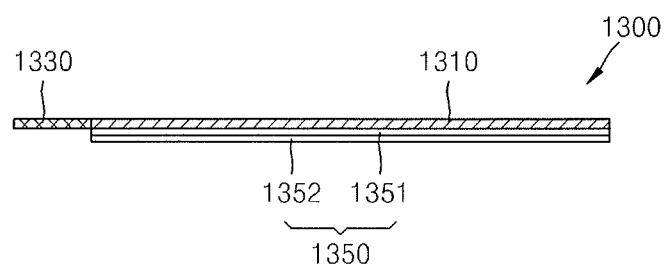
FIG. 13 is a side view of a flexible display device having a slap portion and cut along a length direction according to another embodiment.

FIG. 13 is a side view of a flexible display device 1300 having a slap portion 1350 and cut along a length direction, according to another embodiment. Referring to FIG. 13, the flexible display device 1300 includes a flexible display unit 1310. The slap portion 1350 is mounted under the flexible display unit 1310. The slap portion 1350 includes a transforming portion 1351, and a housing portion 1352 wrapped around the transforming portion 1351.

In this case, a non-transforming portion 1330 is formed at one edge of the flexible display unit 1310. The non-transforming portion 1330 includes a component exhibiting low flexibility, e.g., a rigid element, and may not overlap the slap portion 1350. For example, the non-transforming portion 1330 may be separate from a bending portion of the slap portion 1350. As such, the flexible display device 1300 may bend only in one direction due to the non-transforming portion 1330.

Figure 14A:
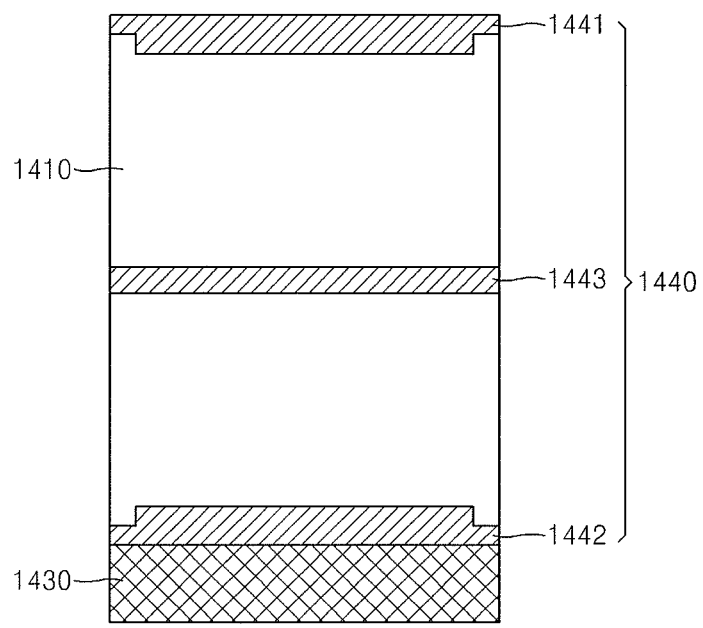
FIG. 14A is a plan view of a flexible display device having a holder, according to an embodiment.
Figure 14B:
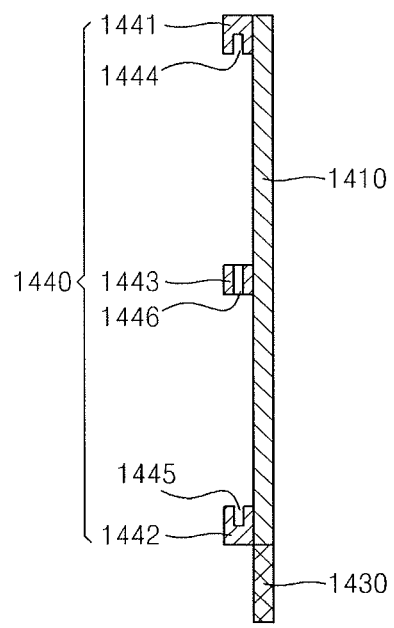
FIG. 14B is a side view of FIG. 14A.

FIG. 14A is a plan view of a flexible display device 1410 having a holder 1440, according to an embodiment, and FIG. 14B is a side view of FIG. 14A.

Referring to FIGS. 14A and 14B, the holder 1440 is formed on the flexible display unit 1410. The holder 1440 includes a first holder 1441 and a second holder 1442 formed at two edges of the flexible display unit 1410. A third holder 1443 functioning as an auxiliary holder may be additionally formed between the first and second holders 1441 and 1442.

A first guide groove 1444 and a second guide groove 1445 are respectively formed in the first and second holders 1441 and 1442. The first and second guide grooves 1444 and 1445 are formed by removing portions of the first and second holders 1441 and 1442. A third guide groove 1446 functioning as an auxiliary guide groove is formed in the third holder 1443. The third guide groove 1446 is formed to penetrate through the third holder 1443. Meanwhile, a non-transforming portion 1430 is formed at one edge of the flexible display unit 1410.

Figure 15A:
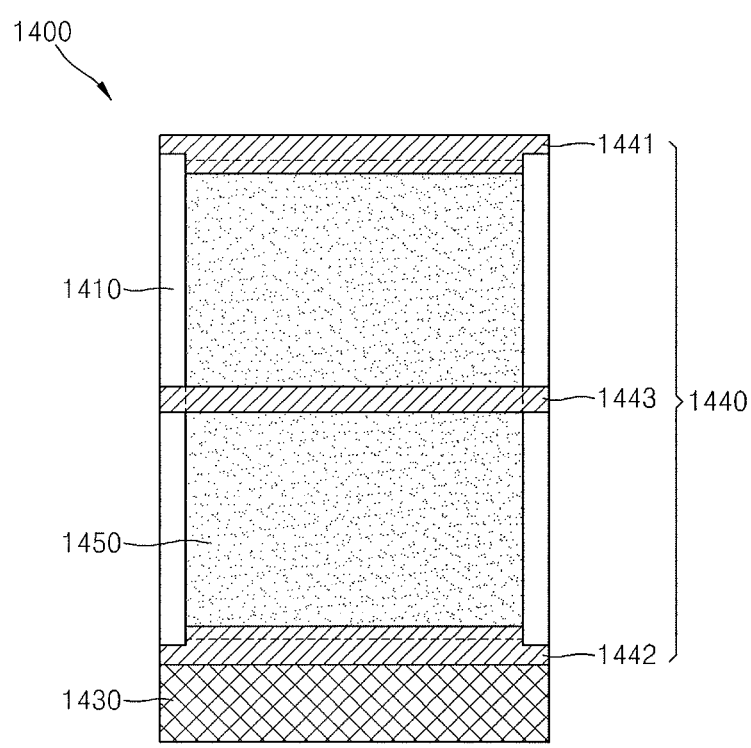
FIG. 15A is a plan view showing that a slap portion is held by the holder of the flexible display device illustrated in FIG. 14A.
Figure 15B:
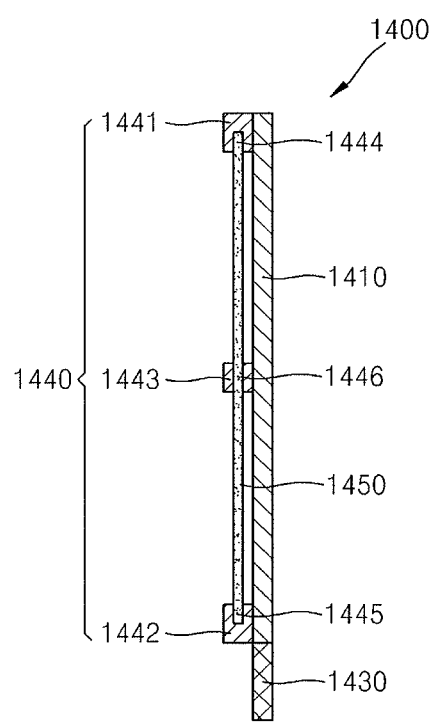
FIG. 15B is a side view of FIG. 15A.

FIG. 15A is a plan view showing a slap portion 1450 held by the holder 1440 of the flexible display device 1400, and FIG. 15B is a side view of FIG. 15A. Here, the slap portion 1450 includes a transforming portion, and may further include a housing portion wrapped around the transforming portion.

Referring to FIGS. 15A and 15B, the slap portion 1450 is formed on one surface of the flexible display unit 1410. In this case, in order to prevent separation of the slap portion 1450 from the flexible display unit 1410 due to a difference in curvature radius therebetween, the slap portion 1450 has a length different from the length of the flexible display unit 1410. The length of the slap portion 1450 is less than the length of the flexible display unit 1410 in FIGS. 15A and 15B. As such, the slap portion 1450 may be inserted into the holder 1440 and may compensate for a difference in circumference between a bent state and a spread state.

In more detail, one edge of the slap portion 1450 is inserted along the first guide groove 1444 of the first holder 1441. Another edge of the slap portion 1450 is inserted along the second guide groove 1445 of the second holder 1442. The third guide groove 1446 prevents motion of the slap portion 1450 at a center portion of the slap portion 1450 so as to allow the slap portion 1450 to be aligned from one edge to another edge of the flexible display unit 1410.

Figure 16:
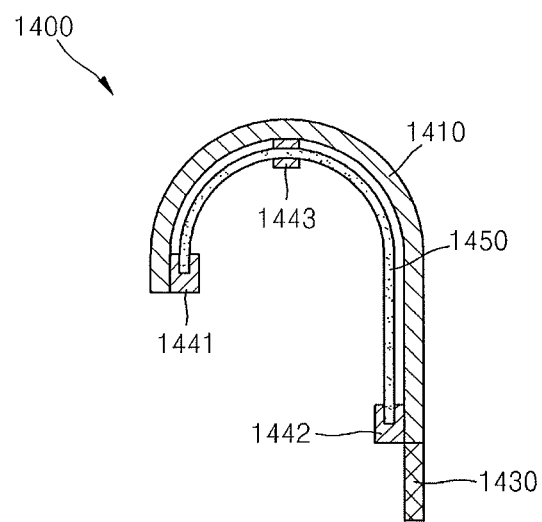
FIG. 16 is a cross-sectional view showing a bent state of the flexible display device illustrated in FIG. 15A.

When the above-described flexible display device 1400 is bent in one direction, as illustrated in FIG. 16, since the slap portion 1450 is held by the holder 1440 with upper and lower margins, the difference in circumference may be offset by the margins. Thus, the flexible display device 1400 may be appropriately bent without causing unnecessary bending.

Figure 17:
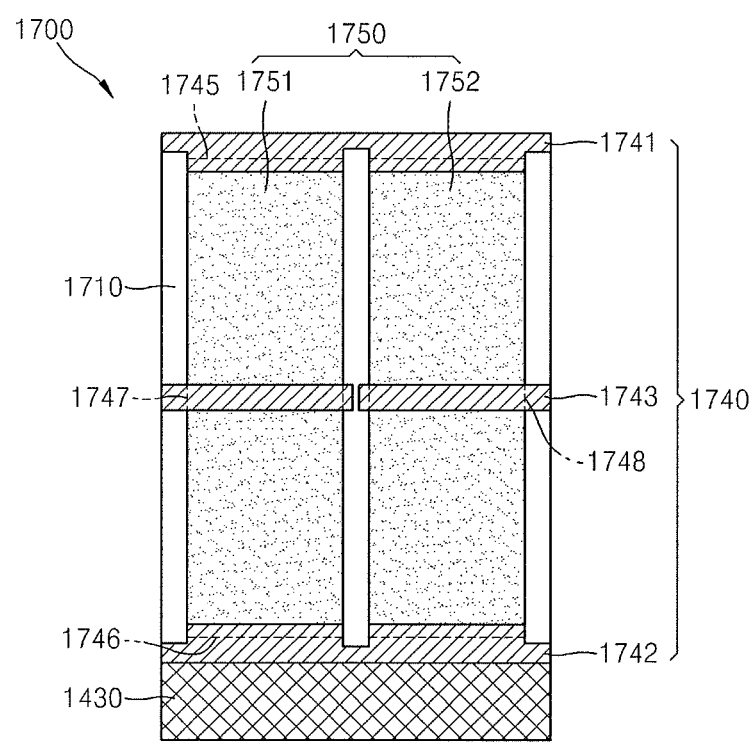
FIG. 17 is a plan view of a flexible display device having a slap portion held by a holder according to another embodiment.

FIG. 17 is a plan view of a flexible display device 1700 having a slap portion 1750 held by a holder 1740, according to another embodiment. Referring to FIG. 17, the holder 1740 is formed on a flexible display unit 1710. The holder 1740 includes a first holder 1741 and a second holder 1742 formed at two edges of the flexible display unit 1710.

Unlike the holder 1440 illustrated in FIG. 14A, a plurality of first guide grooves 1745 and a plurality of second guide grooves 1746 are respectively formed in the first and second holders 1741 and 1742 along a width direction. A third holder 1743 and a fourth holder 1744 may be further formed between the first and second holders 1741 and 1742. A third guide groove 1747 and a fourth guide groove 1748 are respectively formed in the third and fourth holders 1743 and 1744.

The slap portion 1750 is formed on one surface of the flexible display unit 1710. The slap portion 1750 includes a first slap portion 1751 and a second slap portion 1752 in order to adjust rigidity and to provide convenience. As such, the first and second slap portions 1751 and 1752 are inserted into and fixed in the first through fourth guide grooves 1745 through 1748 formed in the first through fourth holders 1741 through 1744.

As described above, according to the example embodiments, due to a slap portion having a curvature along one direction of a flexible display unit, a flexible display device may be both portable and exhibit improved touch capabilities and readability. In other words, the slap portion may provide to the flexible display device both support and a convenient viewing angle due to easy conversion and operability both in a spread state and a bent state.

While the example embodiments has been shown and described above, it will be understood by those of ordinary skill in the art that various changes in form and details may be made therein without departing from the spirit and scope of the example embodiments as defined by the following claims.

What is claimed is:

1. A flexible display device, comprising:
   a flexible display unit to display images, the flexible display unit having two opposing width edges and two opposing length edges, the length edges being longer than the width edges; and
   a slap portion on the flexible display unit, the slap portion having a curvature and being bendable together with the flexible display unit, the slap portion including:
      a transforming portion with a curved cross-section, the curved cross-section having a vertex and two edges; and
      a housing portion wrapped around the transforming portion, the housing portion having a curved cross-section in a width direction, the curved cross-section in a width direction of the housing portion having a curvature corresponding to a curvature of the curved cross-section of the transforming portion,
   wherein the flexible display unit is bonded onto the slap portion, and a non-transforming portion extends from one width edge of the flexible display unit, the non-transforming portion including a rigid element that does not overlap the slap portion.

2. The flexible display device of claim 1, wherein the transforming portion includes a flexible metal sheet.

3. The flexible display device of claim 1, wherein the housing portion includes an elastic material.

4. The flexible display device of claim 1, wherein:
   in a spread state of the slap portion, the transforming portion has the curved cross-section in a width direction and a linear side surface in a length direction, the width direction being a bending direction of the flexible display unit, and the length direction being perpendicular to the width direction, and
   in a bent state of the slap portion, the transforming portion has a linear cross-section in the width direction, and a streamlined side surface in the length direction.

5. The flexible display device of claim 4, wherein the transforming portion has a U-shaped cross-section.

6. The flexible display device of claim 1, wherein the flexible display unit is bonded onto the transforming portion, a curvature of the two opposing width edges of the flexible display unit corresponding to a curvature of the curved cross-section of the transforming portion.

7. The flexible display device of claim 1, wherein the transforming portion has at least one of a solid pattern, a linear pattern, a grid pattern, a wave pattern, a curve pattern, and a zigzag pattern.

8. The flexible display device of claim 1, wherein the housing portion includes:
   a first portion wrapped around the transforming portion; and
   a second portion having space portions outside two opposing edges of the first portion.

9. The flexible display device of claim 8, wherein the second portion is positioned to correspond to two edges of the flexible display unit in a width direction or a length direction of the flexible display unit.

10. A flexible display device, comprising:
    a flexible display unit to display images, the flexible display unit having two opposing width edges and two opposing length edges, the length edges being longer than the width edges; and
    a slap portion on the flexible display unit, the slap portion having a curvature and being bendable together with the flexible display unit,
    wherein the flexible display unit includes at least one holder, the slap portion being held by the at least one holder along a width edge of the flexible display unit, and
    wherein the flexible display unit includes two holders, wherein the two holders are bonded along the two opposing width edges of the flexible display unit, each holder including a guide groove into which the slap portions is fitted.

11. The flexible display device of claim 10, wherein the slap portion has a length smaller than a length of the flexible display unit.

12. The flexible display device of claim 10, wherein the flexible display unit further comprises a protection holder with an auxiliary guide groove in a center portion of the flexible display unit, the slap portion being aligned by the protection holder from one edge to another edge of the flexible display unit.

13. A flexible display device, comprising:
    a flexible display unit to display images, the flexible display unit having two opposing width edges and two opposing length edges, the length edges being longer than the width edges; and
    a slap portion on the flexible display unit, the slap portion having two opposing curved width edges and two opposing length edges, the length edges being longer than the curved width edges, and being bendable together with the flexible display unit, wherein the slap portion includes:

a transforming portion with two opposing curved width edges, the curved width edges having a vertex and two edges extending parallel to the length edges of the flexible display unit, and a housing portion wrapped around the transforming portion, the housing portion having:

a first portion wrapped around the transforming portion, and a second portion having space portions outside two opposing edges of the first portion, the second portion being positioned to correspond to the two opposing width edges or the two opposing length edges of the flexible display unit.

14. The flexible display device of claim 13, wherein the space portions:

are outside two opposing length edges of the first portion; and extend parallel to the length edges of the flexible display unit.

15. The flexible display device of claim 13, wherein the space portions:

are outside two opposing width edges of the first portion; and extend parallel to the width edges of the flexible display unit.

16. The flexible display device of claim 13, wherein the housing portion has a curved cross-section in a width direction, the curved cross-section in a width direction of the housing portion having a curvature corresponding to a curvature of the two opposing curved width edges of the transforming portion.

* * * * *